(12) United States Patent
Azevedo et al.

(10) Patent No.: US 8,098,134 B2
(45) Date of Patent: Jan. 17, 2012

(54) SYSTEMS AND METHODS FOR INTERROGATOR MULTIPLE RADIO FREQUENCY IDENTIFICATION ENABLED DOCUMENTS

(75) Inventors: John Azevedo, San Marcos, CA (US); Rodolfo Monsalvo, Mexico City (MX); Jun Liu, San Diego, CA (US)

(73) Assignee: Neology, Inc., Poway, CA (US)

( * ) Notice: Subject to any disclaimer, the term of this patent is extended or adjusted under 35 U.S.C. 154(b) by 1153 days.

(21) Appl. No.: 11/766,754

(22) Filed: Jun. 21, 2007

(65) Prior Publication Data
US 2008/0084275 A1 Apr. 10, 2008

Related U.S. Application Data

(60) Provisional application No. 60/805,423, filed on Jun. 21, 2006.

(51) Int. Cl.
*H04Q 5/22* (2006.01)

(52) U.S. Cl. ...................................... 340/10.2

(58) Field of Classification Search ............... 340/10.1, 340/10.2, 825
See application file for complete search history.

(56) References Cited

U.S. PATENT DOCUMENTS

| 5,942,977 A * | 8/1999 | Palmer et al. ............... 340/572.5 |
| 6,812,838 B1 * | 11/2004 | Maloney .................... 340/568.1 |
| 2002/0196126 A1 * | 12/2002 | Eisenberg et al. ........... 340/10.2 |
| 2004/0150521 A1 | 8/2004 | Stilp |
| 2005/0110641 A1 | 5/2005 | Mendolia et al. |
| 2005/0186902 A1 | 8/2005 | Lieffort et al. |
| 2006/0012465 A1 * | 1/2006 | Lee et al. ..................... 340/10.2 |

* cited by examiner

*Primary Examiner* — Brian Zimmerman
*Assistant Examiner* — Sara Samson
(74) *Attorney, Agent, or Firm* — Procopio Cory Hargreaves & Savitch LLP; Noel C. Gillespie

(57) ABSTRACT

A multi-document read-write station provides the ability to read/write to a stack of Radio Frequency Identification (RFID) tags within a small area. Specifically, the station provides the ability to read from and write to a tall stack of RFID tagged sheets with the RFID tags stacked one on top of the other. The station and capability described herein is the result of and comprises several components including a closed chamber comprising a document slot, an antenna system, and a power management system.

10 Claims, 3 Drawing Sheets

| | | | | |
|---|---|---|---|---|
| REF: A02610/4 | | PEDIMENTO | | Página 1 de 2 |
| NUM. PEDIMENTO: 04 47 3792 4002926 | | T. OPER: IMP CVE. PEDIMENTO: A1 REGIMEN: IMD | | CERTIFICACIONES |
| DESTINO/ORIGEN: 9 TIPO CAMBIO: 11.12130 | | PESO BRUTO: 115.150 ADUANA E/S 470 | | ADMON. GRAL. DE ADUANAS |

| MEDIOS DE TRANSPORTE | VALOR DOLARES: | 5,603.03 |
|---|---|---|
| ENTRADA/SALIDA: ARRIBO: SALIDA: | VALOR ADUANA: | 62,313.00 |
| 4 4 7 | PRECIO PAGADO/VALOR COMERCIAL: | 62,313.00 |

BANCO 11 BBVA BANCOMER
ADUANA 47 SECC 0
APTO.INTL.CD.MEX.
CAJA 41
OPERACION 00006966
R.F.C. BNC000526RS7
PED. 3792-4002926
09/12/2004 08:36:48
TURNO : T.M.
ELECTRONICO PaHJWMEK
$ 10082
SELLO DE CAJA

DATOS DEL IMPORTADOR/EXPORTADOR

RFC: BNC000526RS7  NOMBRE, DENOMINACION O RAZON SOCIAL
CURP:  BNC, S. A. DE C.V.

DOMICILIO:
VICENTE SUAREZ
No. EXT. 17  No. INT.  C.P. 06040
COL. HIPODROMO, CONDESA MEXICO, D.F.
DF  MEX

| VAL. SEGUROS | SEGUROS | FLETES | EMBALAJES | OTROS INCREMENTABLES |
|---|---|---|---|---|
| 0 | 0 | 0 | 0 | 0 |

ACUSE ELECTRONICO DE  PED.4002926  CLAVE DE LA SECCION ADUANERA
VALIDACION:  DE DESPACHO:
6HMNHMFE  470

MARCAS, NUMEROS Y TOTAL DE BULTOS: S/M  S/N

| FECHAS | | TASAS A NIVEL | | |
|---|---|---|---|---|
| ENTRADA | 07/12/2004 | CONTRIB. | CVE. T. TASA | TAS |
| PAGO | 09/12/2004 | DTA | 7 | 8.00 |
| | | PRV | 2 | 140.00 |

CUADRO DE LIQUIDACION

| CONCEPTO | F.P. | IMPORTE | CONCEPTO | F.P. | IMPORTE | TOTALES | |
|---|---|---|---|---|---|---|---|
| DTA | 0 | 499 | | | | EFECTIVO | 182 |
| IVA | 0 | 9422 | | | | OTROS | 0 |
| PRV | 0 | 161 | | | | TOTAL | 10L 2 |

DATOS DEL PROVEEDOR O COMPRADOR

| ID. FISCAL NOMBRE, DENOMINACION O RAZON SOCIAL | DOMICILIO | VINCULACION |
|---|---|---|
| 363355258 | THATCHER ROAD | NO |
| VERSATILE CARD TECHNOLOGY INC | DOWNERS GROVE, IL | |
| | No. EXT. 5200  No. INT.  C.P. 60515  USA | |

| NUM. FACTURA | FECHA | INCOTERM | MONEDA EXT. | VAL. MON. FACT. | FACTOR MON. EXT. | VAL. DOLARES |
|---|---|---|---|---|---|---|
| 12032004 | 03/12/2004 | FCA | USD | 5,603.00 | 1.00000000 | 5,603.00 |

| NUMERO ( GUIA / ORDEN EMBARQUE ) / ID : | M | 7921 5163 2006 | |
|---|---|---|---|

| IDENTIF. | COMPLEMENTO 1 | COMPLEMENTO 2 |
|---|---|---|
| CR | 147 | |

OBSERVACIONES

-ANEXO FACTURA DE CONFORMIDAD CON EL ART. 38 FRACCION I DE LA LEY ADUANERA EN VIGOR Y REGLA 2.6.1 DE CARACTER GENERAL
-TRADUCCION DE FACTURA CON DESGLOSE DE VALOR TOTAL CORRECTO.

| AGENTE ADUANAL, APODERADO ADUANAL O ALMACEN | DECLARO BAJO PROTESTA DE DECIR VERDAD, EN LOS |
|---|---|
| NOMBRE O RAZ. SOC. : ERNESTO EUGENIO CEVALLOS COPPEL | TERMINOS DE LO DISPUESTO POR EL ARTICULO 81 DE LA |
| RFC: CECE600311DE4  CURP: CECE600311HSLVPR05 | LEY ADUANERA. PATENTE O AUTORIZACION:  3792 |
| MANDATARIO / PERSONA AUTORIZADA | |
| NOMBRE: | |
| RFC:  CURP: | FIRMA AUTOGRAFA |
| TRANSPORTISTA | Destino / Origen: INTERIOR DEL PAIS |

FIG. 2

SYSTEMS AND METHODS FOR INTERROGATOR MULTIPLE RADIO FREQUENCY IDENTIFICATION ENABLED DOCUMENTS

RELATED APPLICATIONS INFORMATION

This application claims priority under 35 U.S.C. 119(e) to Provisional Patent Application Ser. No. 60/805,423, entitled "An RFID Smart Cabinet and a Multi-Document Read Write Station," filed Jun. 21, 2006, which is incorporated herein by reference as if set forth in full.

BACKGROUND

1. Field

The field of the invention relates generally to Radio Frequency Identification (RFID) systems and more particularly to systems and methods for reading and writing information from multiple RFID enabled documents.

2. Background

FIG. 1 illustrates a basic RFID system 100. A basic RFID system 100 comprises three main components: an antenna or coil 104; an interrogator 102, and a transponder, or RF tag 106 which is often electronically programmed with unique information. Antenna 104 can be configured to emit radio signals 108 to activate tag 106 and read and write data from the activated tag 106. Antenna 104 is the conduit between tag 106 and interrogator 102, which is typically configured to control data acquisition and communication. Antennas 104 are available in a variety of shapes and size. For example, in certain embodiments they can be built into a door frame to receive tag data from persons or things passing through the door. In other embodiments, antennas 104 can, for example, be mounted on an interstate toll booth to monitor traffic passing by on a freeway. Further, depending on the embodiments, the electromagnetic field, i.e., radio signal 108, produced by an antenna 104 can be constantly present when, e.g., multiple tags 106 are expected continually. If constant interrogation is not required, then radio signal 108 can, for example, be activated by a sensor device.

Often antenna 104 is packaged with interrogator 102. A conventional interrogator 102 can emit radio signals 108 in ranges of anywhere from 1 inch to 100 feet or more, depending upon the power output and the radio frequency used. When an RFID tag 106 passes through an electromagnetic zone associated with radio signal 108, it detects radio signal 108, which can comprise an activation signal. In some embodiments, interrogators can comprise multiple antenna, though typically only one transmits at a time.

Additionally, interrogator 102 is often coupled through network 110 to a central server 112. Central server 112 can be configured to execute a number of applications including those that incorporate data from RFID tags 106. For example, in a tracking system, interrogator 102 transmits to the central server 112 the identity of tags that have passed through its interrogation zone. This information can be correlated to objects associated with the tag in a database residing on the central server and hence the whereabouts of the object in question at that particular time can be logged. In the example of a toll booth, tags that pass through the specific toll both are reported to central server 112, which correlates the tag to a motorist who is then debited the cost of the toll.

RFID tags 106 come in a wide variety of shapes and sizes. Animal tracking tags inserted beneath the skin, for example, can be as small as a pencil lead in diameter and one-half inch in length. Tags 106 can be screw-shaped to be inserted into trees or wooden items for identification purposes, or credit-card shaped for use in access applications. Anti-theft hard plastic tags attached to merchandise in stores can include RFID tags. In addition, heavy-duty RFID tags can be used to track containers, heavy machinery, trucks, and/or railroad cars for maintenance and/or tracking purposes.

RFID tags 106 are categorized as either active or passive. Active RFID tags 106 are powered by an internal battery and are typically read-write, i.e., tag data can be rewritten and/or modified. An active tag's memory size varies according to application requirements. For example, some systems operate with up to 1 MB of memory. The battery-supplied power of an active tag 106 generally gives it a longer read range. The trade off is greater size, greater cost, and a limited operational life.

Passive RFID tags 106 operate without a separate external power source and obtain operating power from radio signal 108. Passive tags 106 are consequently much lighter than active tags 106, less expensive, and offer a virtually unlimited operational lifetime. The trade off is that they have shorter read ranges than active tags 106 and require a higher-powered interrogator 102. Read-only tags 106 are typically passive and are programmed with a unique set of data, usually 32 to 128 bits, that cannot be modified. Read-only tags 106 often operate in the same way as linear barcodes. It should be noted that passive tags can also be used in read-write systems.

RFID systems are also distinguishable by their frequency ranges. Low-frequency, e.g., 30 KHz to 500 KHz, systems 100 have short reading ranges and lower system costs. They are commonly used in security access, asset tracking, and animal identification applications. High-frequency, e.g., 850 MHz to 950 MHz and 2.4 GHz to 2.5 GHz 100 systems offer long read ranges, e.g., greater than 90 feet, high reading speeds, and are used for such applications as railroad car tracking and automated toll collection; however, the higher frequency RFID systems 100 typically result in higher system costs.

RFID systems employ a type of modulation known as backscatter modulation. In a backscatter system, the tags do not generate their own RF carrier signal. Rather, interrogator 102 generates a carrier signal that it broadcasts within its coverage area. The tags then reflect this signal back to interrogator 102. The reflection of the carrier signal is termed backscatter. In order to communicate information on the backscattered signal, the tag will alternatively reflect and not reflect the signal in order to indicate "1"s and "0"s to interrogator 102. This is termed backscatter modulation.

The significant advantage of all types of RFID systems 100 is the noncontact, non-line-of-sight nature of the technology. Tags 106 can be read through a variety of substances such as snow, fog, ice, paint, crusted grime, and other visually and environmentally challenging conditions, where barcodes or other optically read technologies cannot typically be used. RFID tags 106 can also be read in challenging circumstances at high speeds, often responding in less than 100 milliseconds. RFID has become indispensable for a wide range of automated data collection and identification applications that would not be possible otherwise.

One area where passive RFID tags have proven potentially useful is in tracking documents. For example, a passive RFID tag shaped like a small sticker, or label can be affixed to a highly confidential document in order to track access to and the location of the document. In other words, if someone wants to access the document, which can be stored in a cabinet, then they can be required to scan the document out. Likewise, they can be required to scan the document in once they have returned it. In this manner, a record of when the document is "checked-out" can be maintained. Such a process can be combined with security mechanism limiting access to the cabinet as well as a mechanism to log who checked the document out.

Such a system, however, can prove cumbersome if there a many documents being checked in an out by multiple users. For example, in a conventional system, each document must be scanned in and out individually, otherwise the tags on each document will interfere with each other. RFID tags suffer from detuning and cross coupling (sharing energy) when two or more tags are placed in each other's effective area. The effective area is ¼ of the Radio Frequency (RF) wave length. For example, at 2401 MHz this is equivalent to 1.2 inches. When a document is tagged and then stacked on top of another tagged document, the result are two tag documents where the RFID tag is separated only by the thickness of the sheet of paper. This separation is insufficient to allow the two tags to work optimally resulting in the inability of the interrogator to communicate properly to the RFID tag. This problem is compounded when more tag documents are stacked.

SUMMARY

A multi-document read-write station provides the ability to read/write to a stack of Radio Frequency Identification (RFID) tags within a small area. Specifically, the station provides the ability to read from and write to a tall stack of RFID tagged sheets, or documents with the RFID tags stacked one on top of the other. The station and capability described herein is the result of and comprises several components including a closed chamber comprising a document slot, an antenna system, and a power management system.

In one aspect, the chamber walls can be conductive to maintain high field strength around the documents and generate a specific mode with respect to the Radio Frequency (RF) signals. The chamber wall can, for example, be metalized using a metallic film or perforated metal to contain the RF energy and allow light through simultaneously so that the chamber contents are visible.

In another aspect, the chamber can comprise a non conductive document slot that holds the RFID tagged documents and positions them in the chamber where the field strength is high. The chamber can have an access door with an interlock to prevent radiation while being loaded or unloaded.

In another aspect, the slot can be constructed at an angle to force the documents to slide to the end of the slot. Additionally, the end of the document slot can be angled to introduce tag offset separation and greater tag spacing.

In another aspect, the chamber's dimensions can be configured to resonate at a given frequency for a given number of modes.

In another aspect, multiple radiating elements (antennas) can be included to facilitate the reading/writing of items.

In another aspect, one power setting can be used for reading and an elevated power setting for writing. Since passive RFID needs more power to write then to read, having separate power setting for the read and write process can reduce the tags exposure to high power.

In another aspect, the RFID tags can be tuned specifically for this environment by introducing thin features to reduce detuning effects and greater efficiency when placed inside a stack of documents.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 2 is illustrates a document that includes an RFID tag for use in conjunction with the systems and methods described herein.

DETAILED DESCRIPTION

The embodiments described below are directed to systems and methods for reading from and writing to multiple RFID tags on multiple documents, especially when the documents are stacked on top of each other. It should be pointed out, however, that the embodiments described herein are by way of example only and should not be seen as limiting the systems and methods described herein to particular configurations, processes, or applications. For example, the systems and methods described herein can be used with other tagged items.

FIG. 2 illustrates a document 200 that comprises an RFID tag 202. RFID tag 202 can comprise a chip that includes the circuitry necessary to power the tag and perform required functions, as well as memory to store information. RFID tag 202 can be a read only tag or a read-write tag depending on the embodiment. Identifying information, i.e., information identifying document 200 can be written into the memory of tag 202 either in the factory or after tag 202 is affixed to document 200.

The chip can be coupled with an antenna configured to resonant at a certain frequency, or frequencies. The antenna can be formed from conductive material such as metal. Alternatively, and often preferable, the antenna can be formed from a conductive paste or ink applied to a thin substrate such as a plastic substrate. Thus, the antenna can be formed on the substrate and the chip can then be coupled to the antenna, e.g., using a conductive adhesive. An adhesive layer can then be applied to the back of the substrate so that it can be applied like a sticker, or label to document 200.

Figure 1:
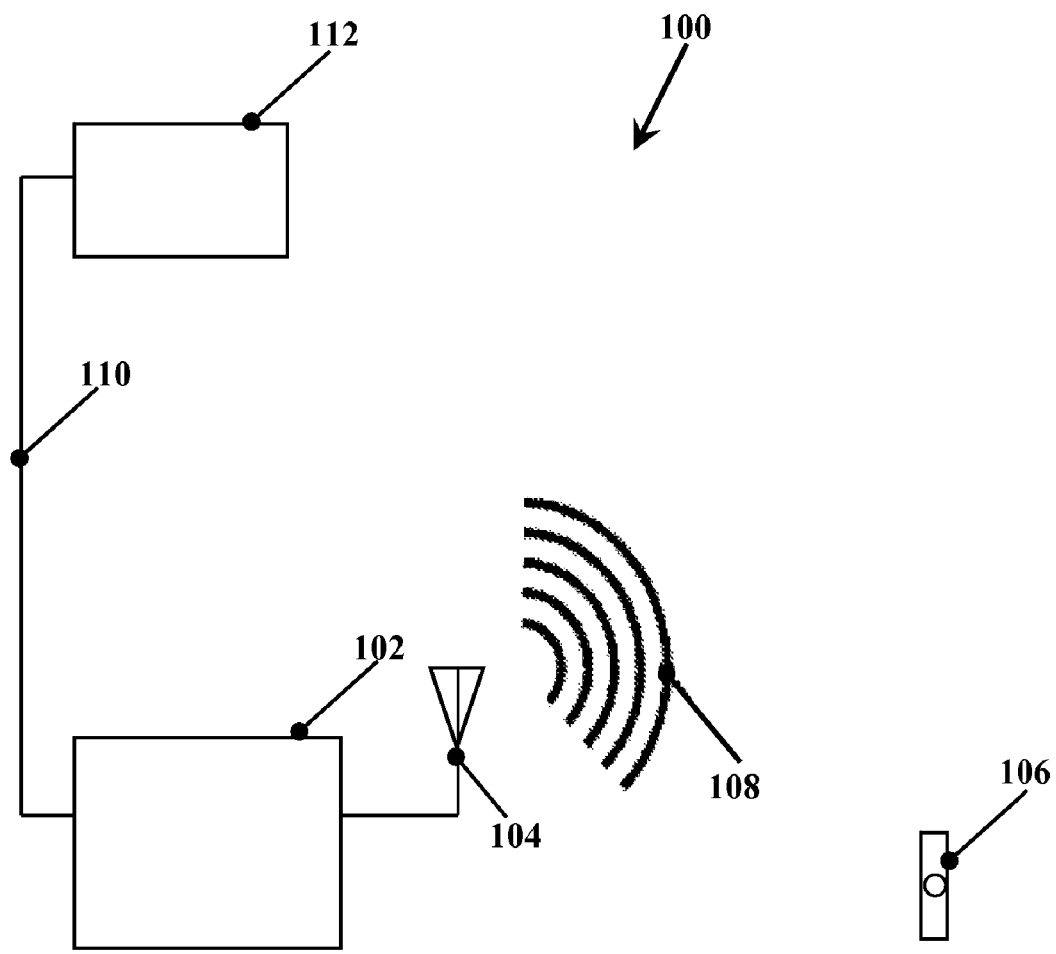
FIG. 1 is a diagram illustrating a conventional RFID system.
Figure 3:
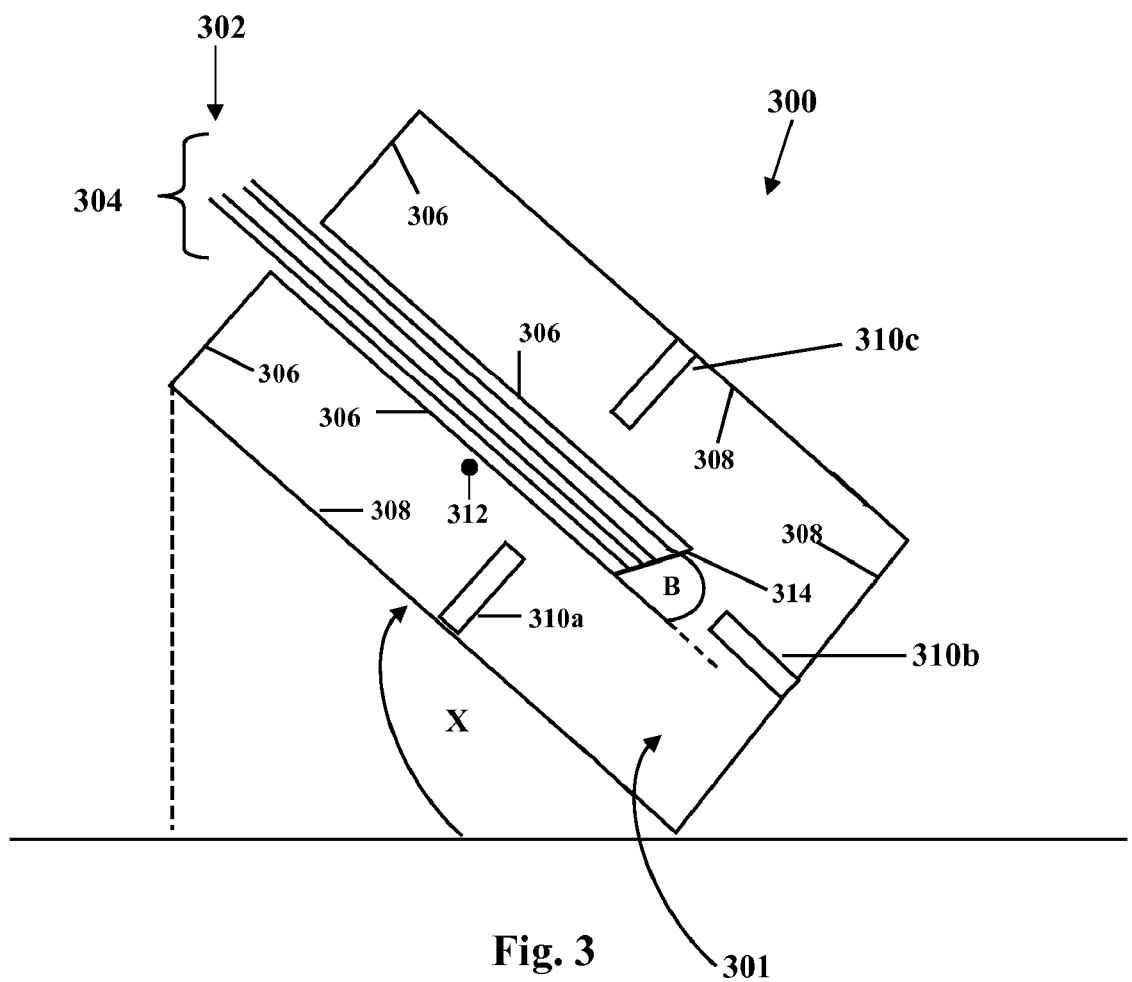
FIG. 3 is a diagram illustrating an example multi-document read-write station configured in accordance with one embodiment.

FIG. 3 is a diagram illustrating a multi-document read-write station 300 configured in accordance with one embodiment. Station 300 comprises a chamber 301 with a slot 302 into which documents 304, e.g., documents such as document 200, can be placed wither when being checked out or checked in. It will be understood that FIG. 3 provide a cross sectional view of station 300 and that chamber walls 308 will actually surround slot 302. Chamber walls 308 can be conductive to maintain high field strength around slot 302 and to generate a specific mode, or modes of operation with respect to the RF signals being generated. For example, walls 308 can be made conductive via a metalized film applied to the chamber walls. Alternatively, chamber walls 308 can be made from metal.

For example, in one embodiment, at least some of walls 308 can be constructed from perforated metal to contain the RF energy and allow light through simultaneously so that the chamber contents, i.e., documents 304, are visible.

Slot 302 can be non-conductive, i.e., be formed from no-conductive walls 306. Slot 302 can be configured to hold RFID tagged documents 304 and position them within chamber 301 where the RF field strength is high. The RF field is generate by one or more antennas 310 position near, or around slot 302. It will be understood that antennas 310 are interfaced with and interrogator (not shown), such as interrogator 102 describe above.

Slot 302 can be constructed at an angle (α) to force documents 304 to slide to the end of the slot. Additionally, slot 302 comprises an angled stop wall 314 to introduce tag offset separation and greater tag spacing. In other words, by including stop wall 314 angled at angle (β), the tops of documents 304 will be offset with respect to each other. Assuming that the RFID tags, e.g., tags 202, are placed at the same location on each document, then this will also create and offset in the location of each tag with respect to the other tags. This reduces the detuning and cross coupling referred to above and enables reading of tags from multiple documents.

It will be understood that the dimensions of slot 302, the location of the tags on the documents, and the angels (α) and (β), will all depend on the requirements of specific implementation, including the documents size, frequency being used, dimensions of chamber 301, etc. In this regard, the dimensions of chamber 301 can be configured so that chamber 301 will resonate at a given frequency and for a given number of modes. As a result, the RF field can be effectively amplified allowing lower power system design and increasing write capabilities.

In a large stack of documents 304, the greatest amount of cross coupling will occur in the middle of the stack. As a result, tags in the middle of the stack will require greater read and write energies. Conversely, tags located on the top and bottom will require less energy than tags in the middle. Since the system must be designed to read and write to tags in the middle, the resulting energy levels can be too high for proper operation of tags on the top and bottom.

The RF energy, e.g. produced by antennas 310 is converted by the tag chip into a voltage that can be used to power the tag. If the energy is too high, then this can result a chip voltage that is too high for proper operation of the tags on top and bottom. To correct for this, attenuation and or detuning pads (not shown) can be placed on the top and bottom of slot 302 to attenuate and or detune the top and bottom tags so that the chip voltage is the same level as that of the tags in the middle.

Certain embodiments can employ harmonic reception of signals being returned by the tags. Due to the nature of passive RFID, reception of a backscatter modulation on the carrier signal, or frequency can be challenging. Allowing the receiver to listen on one or multiple harmonics of the tag aids the system reception. The term harmonic is well understood and will not be explained here for the sake of brevity.

As illustrated in FIG. 3, multiple radiating elements 310a, 310b, and 310c can be used to facilitate the reading/writing of items. It will be understood that the use of multiple antennas creates spatial diversity, and possibly phase diversity, which increases the likelihood of successful reception of the signals. The system can also be configured to alter the frequency being used to further enhance spatial diversity on any of the active antennas. This requires that antennas 310 as well as the tag antennas be configured for multi-frequency operation.

To further improve system performance, the antenna system can comprise separate transmit (310) and receive (312) antennas. Receive antenna 312 can be positioned in close proximity to the tags for high sensitivity to tags response and at a greater distance to the transmit antennas 310 for high isolation, i.e., receive antenna 312 can be positioned at a low field strength area. This should result in improved signal to noise ratio when compared to combine transmit and receive systems.

In certain embodiments, for example receive antenna 312 can be an opened ended wave guide with directionality. For simplicity, only one receive antenna 312 can be used; however, in other embodiments multiple receive antennas 312 can be used.

In certain embodiments, one power setting can be used for reading and an elevated power setting can be used for writing. Since passive RFID needs more power to write then to read, having separate power setting for the read and write process can reduce exposure to high power RF fields for the tags.

For example, in one embodiment the system can be configured to rely on tag encode information to determine what power setting to use. This can be accomplished, for example, by writing information into each tag indicting the number of documents present in slot 302. For example, when the first document is placed in slot 302 the number 1 can be written into the corresponding tag. When a second document is placed into slot 302, then the number 2 can written into each tag. The system can the be configured to read this number out of the tags in order to determine a power setting. For example, if the number 10 is read out of documents 304, then the system knows that 10 documents are present and it can be configured to automatically set the power to the appropriate level for 10 documents. By doing this, the system can eliminate the possibly of overpowering tags in situation where only 1 exist and under powering when 10 or more exists.

In another embodiment, the transmission power of the interrogator (including antenna) can operate within a range. For example, the transmission power can start with the minimum power setting with a long transmission period and a short idle period. The transmission power can then be cycled upwards at defined intervals. When the transmission power goes up, the transmission period gets shorter while the idle period gets longer so that the average transmission power is at the same level. Once the transmission power reaches the maximum, it should go back to the minimum.

On the tag side, the tags can be tuned specifically for the environment by introducing thin features to reduce detuning effects and greater efficiency when placed inside a stack of documents.

Thus, by implementing some or all of the aspects described above a multi-document read-write system capable of reading from and writing to multiple RFID tagged documents can be constructed. This can greatly reduce the burden of implementing RFID controlled document systems.

While certain embodiments have been described above, it will be understood that the embodiments described are by way of example only. Accordingly, the embodiments should not be limited based on the described embodiments. Rather, embodiments described herein should only be limited in light of the claims that follow when taken in conjunction with the above description and accompanying drawings.

What is claimed is:

1. A system for communicating with a plurality of Radio Frequency Identification (RFID) tags affixed to a plurality of documents, comprising:
   a Radio Frequency (RF) radiating antenna for communicating via RF signals with the plurality of RFID tags;
   a chamber comprising conductive walls, the chamber configured to maintain a high RF field strength; and
   a slot within the chamber, the slot comprising no-conductive walls and an angled stop wall, the slot configured to hold the plurality of documents in a location such that the plurality of RFID tags are exposed to the high RF field strength and to create an offset between the RFID tags.

2. The system of claim 1, wherein the chamber is configured to resonate at an operational frequency for the system.

3. The system of claim 1, wherein the radiating antenna is configured to receive RF signals from the plurality of RFID tags, and wherein the radiating antenna is configured to receive harmonic signals from the plurality of RFID tags.

4. The system of claim 1, further comprising a receive antenna configured to receive RF signals from the plurality of RFID tags, wherein the receive antenna is separate from the radiating antenna and positioned close to the plurality of RFID tags.

5. The system of claim 1, wherein the receive antenna is configured to receive harmonic signals from the plurality of RFID tags.

6. The system of claim 1, further comprising a plurality of radiating antennas located at different locations within the chamber and around the slot.

7. The system of claim 1, configured to use multiple frequencies for communication with the plurality of RFID tags.

8. The system of claim 1, wherein a transmit power for RF signals generated by the radiating antenna are cycled within a range.

9. The system of claim 1, wherein the transmit power for signals generated by the radiating antenna is determined based on the number of documents present as determined by a numbering mechanism.

10. The system of claim 1, further comprising detuning pads positioned on the top or bottom of the slot.

\* \* \* \* \*